(12) United States Patent
Shoji

(10) Patent No.: US 7,262,489 B2
(45) Date of Patent: Aug. 28, 2007

(54) THREE-DIMENSIONALLY FORMED CIRCUIT SHEET, COMPONENT AND METHOD FOR MANUFACTURING THE SAME

(75) Inventor: Kazuno Shoji, Funabashi (JP)

(73) Assignee: Polymatech Co., Ltd., Tokyo (JP)

( * ) Notice: Subject to any disclaimer, the term of this patent is extended or adjusted under 35 U.S.C. 154(b) by 0 days.

(21) Appl. No.: 10/983,934

(22) Filed: Nov. 8, 2004

(65) Prior Publication Data

US 2005/0098857 A1    May 12, 2005

(30) Foreign Application Priority Data

Nov. 12, 2003  (JP)  ............................. 2003-382844

(51) Int. Cl.
*H01L 21/302* (2006.01)
(52) U.S. Cl. .................. 257/642; 257/643; 257/645; 257/647; 257/679; 438/725; 361/679
(58) Field of Classification Search ................ 257/642, 257/645, 647, 679, 692, 451, 787; 438/108, 438/616, 611
See application file for complete search history.

(56) References Cited

U.S. PATENT DOCUMENTS

| | | | |
|---|---|---|---|
| 5,233,753 A | | 8/1993 | Wolf et al. |
| 6,380,614 B1 * | | 4/2002 | Higuchi et al. ............. 257/679 |
| 6,426,143 B1 * | | 7/2002 | Voss et al. ................. 428/378 |
| 6,537,359 B1 | | 3/2003 | Spa |

FOREIGN PATENT DOCUMENTS

| | | |
|---|---|---|
| DE | 100 23 015 A1 | 1/2002 |
| EP | 0 477 981 A2 | 4/1992 |
| EP | 0 688 839 B1 | 12/1995 |
| JP | 62-205687  * | 9/1987 |
| JP | 6-188537 A | 7/1994 |
| JP | 08-003502 | 1/1996 |
| JP | 09-129995 A | 5/1997 |
| JP | 09-319068 A | 12/1997 |
| JP | 2001-36240 A | 2/2001 |
| WO | WO 01/86276 A1 | 11/2001 |

* cited by examiner

*Primary Examiner*—Sue A. Purvis
*Assistant Examiner*—Fazli Erdem
(74) *Attorney, Agent, or Firm*—Crompton, Saeger & Tufte, LLC

(57) ABSTRACT

A three-dimensionally formed circuit sheet comprises a resin film and a circuit pattern formed of an electrically conductive paste on the resin film. The electrically conductive paste contains, as a binder, a resin that is three-dimensionally formable. The resin film and the circuit pattern are formed in a three-dimensional shape. A method for manufacturing the three-dimensionally formed circuit sheet is also provided. The method comprises forming a circuit pattern on a resin film using an electrically conductive paste by means of printing, wherein the electrically conductive paste contains a resin that is three-dimensionally formable, and press molding the resin film including the circuit pattern into a three-dimensional shape. Additionally, a three-dimensionally formed circuit component comprising a three-dimensionally formed circuit sheet and a base member and a method for manufacturing the same are disclosed.

10 Claims, 2 Drawing Sheets

THREE-DIMENSIONALLY FORMED CIRCUIT SHEET, COMPONENT AND METHOD FOR MANUFACTURING THE SAME

BACKGROUND OF THE INVENTION

The present invention relates to a circuit sheet and the components thereof having a three-dimensional structure and a method for manufacturing the same. These circuit sheet and components are used in display panels or operation panels for household electrical appliances, and switching parts for mobile telephones, portable information devices, or interior parts of motor vehicles.

In such a three-dimensionally formed circuit sheet, circuit patterns has been conventionally formed on a three-dimensional film substrate by a photographic method (ultraviolet exposure method) or a plating method that are typically used for manufacturing printed wiring boards.

Japanese Laid-Open Patent Publication No. 9-319068 discloses a method for manufacturing a three-dimensionally formed circuit component using a photographic method. According to the manufacturing method, a photomask is formed using two-dimensional and three-dimensional masks, and a three-dimensionally formed substrate previously subjected to plating and resist treatments is prepared. Then, the three-dimensionally formed substrate is exposed and developed in a state wherein the photomask is in close contact with the three-dimensionally formed substrate, to form an electric-circuit pattern on the three-dimensionally formed substrate.

Japanese Laid-Open Patent Publication No. 9-129995 discloses a method for manufacturing a three-dimensionally formed circuit component using a plating method. According to the manufacturing method, a circuit pattern consisting of an electrically conductive layer is formed by printing on the surface of a flatly molded electrical insulating layer, followed by bending the molded electrical insulating layer into a three-dimensional shape. Then, a metal layer is formed on the electrically conductive layer by plating.

Japanese Laid-Open Patent Publication No. 2001-36240 describes a transferring method for forming a circuit pattern by thermally transferring a film, on which a circuit pattern is formed of a copper foil or the like, onto a substrate.

However, the formation of a circuit sheet using photographic or plating methods requires a number of chemicals including an etchant and a plating solution in processing steps such as a step of roughing the surface of the resin. Since wastes from such chemicals cause significant damage to the global environment, environmental protection for a manufacturing process and the control of the used chemicals are complicated.

In the transferring method, a transfer film having a circuit pattern must be previously fabricated. In addition, since the transfer of the film onto the curved or corner portions of the substrate is difficult, the shape of the substrate on which a circuit can be formed is limited.

In the circuit component disclosed in Japanese Laid-Open Patent Publication No. 2001-36240, a resin film and a circuit pattern are three-dimensionally formed individually, and are integrated by laminating in a mold. In this case, a number of molding steps are required leading to increase in manufacturing costs.

The present invention has been devised for solving such conventional problems, and an objective of the present invention is to provide a three-dimensionally formed circuit sheet and components that can be manufactured through a simple process without breakage of circuit patterns, and a method for manufacturing the same.

BRIEF SUMMARY OF THE INVENTION

The present invention provides a three-dimensionally formed circuit sheet comprising a resin film and a circuit pattern formed of an electrically conductive paste on the resin film. The electrically conductive paste contains, as a binder, a resin that is three-dimensionally formable. The resin film and the circuit pattern are formed in a three-dimensional shape.

A three-dimensionally formed circuit component is also provided. The circuit component comprises a three-dimensionally formed circuit sheet as above described and a resin base member on which the three-dimensionally formed circuit sheet is laminated.

The present invention provides a method for manufacturing a three-dimensionally formed circuit sheet. The method comprises steps of forming a circuit pattern on a resin film using an electrically conductive paste by means of printing, wherein the electrically conductive paste contains a resin that is three-dimensionally formable, and press molding the resin film including the circuit pattern in a three-dimensional shape.

The present invention further provides a method for manufacturing the three-dimensionally formed circuit component comprising a three-dimensionally formed circuit sheet and a resin base member. The method comprises steps of producing a three-dimensionally formed circuit sheet and integrally molding the resin base member with the three-dimensionally formed circuit sheet by setting the circuit sheet in a mold for injection molding and injecting a molten resin for the resin base member into the mold. The step of producing a three-dimensionally formed circuit sheet includes forming a circuit pattern on a resin film using an electrically conductive paste by means of printing, wherein the electrically conductive paste contains a resin that is three-dimensionally formable, and press molding the resin film including the circuit pattern in a three-dimensional shape.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3(*b*) is a perspective view showing the stretched state of a circuit sheet.

DETAILED DESCRIPTION OF THE PREFERRED EMBODIMENTS

Figure 1:
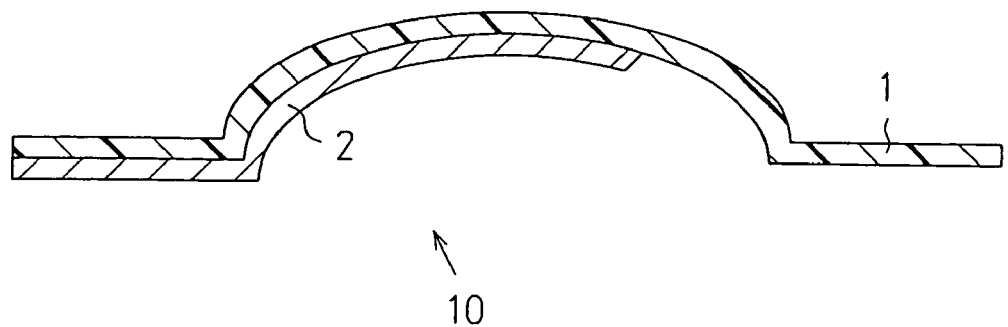
FIG. 1 is a longitudinal sectional view showing a three-dimensionally formed circuit sheet of the present invention.

The embodiments of the present invention will be described in further detail below. FIG. 1 shows a three-dimensionally formed circuit sheet 10 as one embodiment of the present invention. The three-dimensionally formed circuit sheet 10 comprises a resin film 1 that is three-dimensionally formable and a circuit pattern 2 formed on a side of the resin film 1. The circuit pattern 2 on the resin film 1 is formed of an electrically conductive paste containing a resin ink as a binder by using a printing method such as screen-printing. The resin film 1 having the circuit pattern 2 thereon is formed into a three-dimensional shape by, for example, press molding to form the three-dimensionally formed circuit sheet 10. Namely, the resin film 1 and the circuit pattern 2 are integrally formed into a three-dimensionally shape. In this embodiment, the three-dimensionally formed circuit sheet 10 is three-dimensionally shaped into a domed shape.

Figure 2:
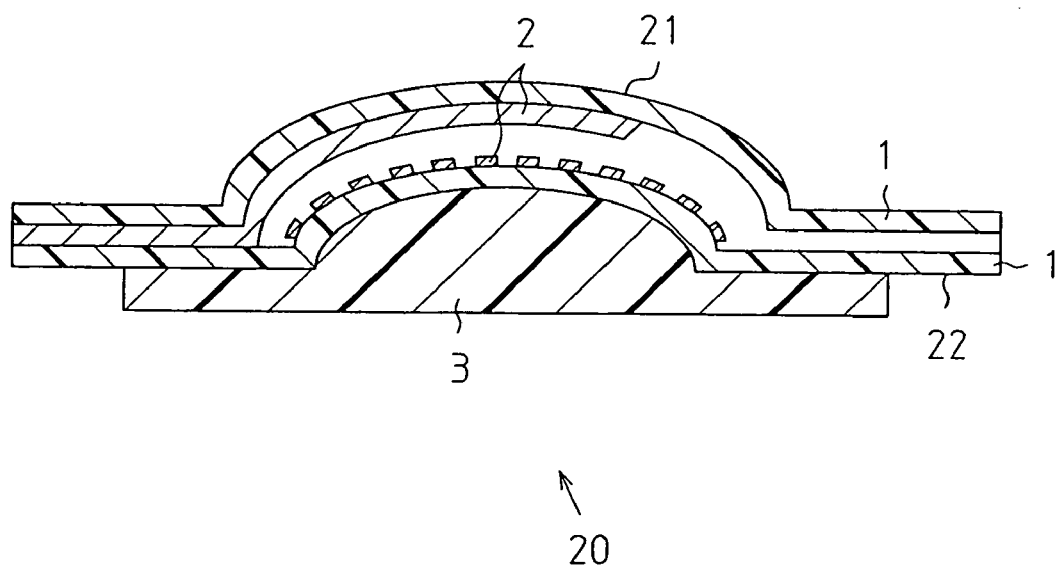
FIG. 2 is a longitudinal sectional view showing a component of a three-dimensionally formed circuit sheet of the present invention.

FIG. 2 shows a three-dimensionally formed circuit component 20, which is another embodiment of the invention. The three-dimensionally formed circuit component 20 comprises two three-dimensionally formed circuit sheets 21 and 22, and a resin base member 3. On one side of each resin film 1 that is three-dimensionally formable, a circuit pattern 2 is formed of an electrically conductive paste containing a resin ink as a binder by using a printing method such as screen printing. Such a film is formed into a three-dimensional shape by, for example, press molding to form the three-dimensionally formed circuit sheets 21, 22 respectively. Then, the three-dimensionally formed circuit sheets 21, 22 are integrally formed with the resin base member 3 to fabricate the three-dimensionally formed circuit component 20.

The resin film 1 may be a flat sheet that is three-dimensionally formable before formed into a three-dimensionally shape. This resin film 1 may be a light-transmitting resin film, such as a colorless transparent film or a translucent colored film, or may be an opaque resin film. As the resin film, various resin films that excel in flexibility can be used. Examples of such resin films include polyester-based, polyethylene-based, polypropylene-based, polyamide-based, and thermoplastic elastomer-based resin films. Among these films, a polycarbonate film, a polycarbonate/polybutyl terephthalate alloy film, or a polyethylene terephthalate film is preferably used, because such films have good properties for both transparency and formability. Although the thickness of the film is not specifically limited, a thickness of 50 to 200 μm is preferable. A film thickness of less than 50 μm may cause curling of the film during printing of circuit patterns. Also, a film thickness of more than 200 μm may decrease the formability of the film.

Examples of methods of three-dimensional forming include vacuum molding, press molding, and hydroforming, but not limited thereto.

The binder contained in the electrically conductive paste must contain a resin having flexibility and three-dimensional formable properties as the major component.

Examples of resins in the binder include polyester-based resins, urethane-based resins, epoxy-based resins, acrylic resins, acryl urethane-based resins, polyolefin-based resins, and polyvinyl chloride-based resins. Among these resins, polyester-based resins such as polycarbonate resins, urethane-based resins, and epoxy-based resins are preferable in view of adhesion to the resin film 1, flexibility, and expandability. Especially, it is preferable that the binder contains a polycarbonate resin containing a carbonate structure unit represented by the following formula (I), which is described in European Patent No. EP0688839B1.

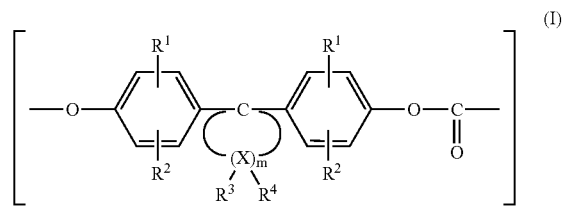

This resin has a weight-average molecular weight of at least 10,000 and comprises a thermoplastic aromatic polycarbonate containing bifunctional carbonate structure units of the formula (I), wherein $R^1$ and $R^2$ independently represent hydrogen, a halogen, $C_{1-8}$ alkyl, $C_{5-6}$ cycloalkyl, or $C_{6-10}$ aryl alkyl; m represents an integer from 4 to 7; $R^3$ and $R^4$ independently represent hydrogen or a $C_{1-6}$ alkyl, and can be independently selected with respect to each X; X represents at least one carbon atom; and both $R^3$ and $R^4$ are alkyl groups. It is preferable that $R^3$ and $R^4$ simultaneously represent an alkyl group with respect to at least one of the plurality of X.

When this polycarbonate resin is used as a binder, the weight-average molecular weight is preferably within a range between 20,000 and 300,000.

A specific example of the polycarbonate resin containing the unit of the formula (I) is a copolymer of 1,1-bis-(4-hydroxyphenyl)-3,3,5-trimethyl cyclohexane and bisphenol-A represented by the following formula (II).

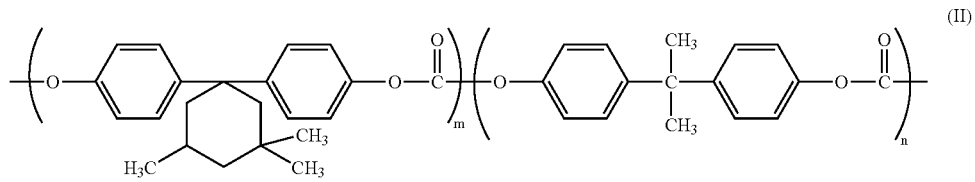

The electrically conductive paste also contains electrically conductive powder. As the electrically conductive powder, non-metallic powder such as carbon black powder can be used. Alternatively, powders of a noble metal such as gold, silver and palladium; a base metal such as copper and nickel; or an alloy thereof can also be used as the electrically conductive powder. The average particle diameter of the electrically conductive powder is preferably in a range from 0.3 to 10 μm. If the average particle diameter of the electrically conductive powder exceeds 10 μm, the electrically conductive paste containing such powder tends to cause an electrical conduction failure since the number of contact points between the particles of the electrically conductive powder in the paste is decreased. Accordingly, such an electrically conductive paste cannot be used for practical applications. If electrically conductive powder having an average particle diameter of less than 0.3 μm is used in the electrically conductive paste, the particles of such electrically conductive powder are easily coagulated, and it becomes difficult to print the electrically conductive paste evenly on the resin film 1. The electrically conductive powder can be prepared using, for example, a mechanical grinding method, an atomizing method, a reduction method, an electrolytic method, or a gas-phase method. The shape of the electrically conductive powder may be any shape. However, scale-like or flaky electrically conductive powder having a large aspect ratio is preferable, because a circuit pattern formed of the electrically conductive paste containing such electrically conductive powder may have lower electric resistance in comparison with one formed of an electrically conductive paste containing spherical electrically conductive powder.

An example of the printing method for forming the circuit pattern 2 is screen-printing; however, other printing methods may also be used.

The resin base member 3, integrally molded with the resin film 1, maybe formed of any resins having various compositions, types, and elastic moduli. Examples of resins for the resin base member 3 include polycarbonate, polymethyl methacrylate, styrene-based, acrylic, polyolefin-based, ABS, polyester-based, epoxy-based, polyurethane-based, polyamide-based, and silicone-based resins.

The method for manufacturing the three-dimensionally formed circuit sheet 10 of this embodiment includes steps of forming a circuit pattern 2 on a resin film 1 by a printing method using an electrically conductive paste to form a circuit sheet; and forming the circuit sheet (namely, the resin film 1 and the circuit pattern 2) into a three-dimensional shape using press molding or the like.

The method for manufacturing the three-dimensionally formed circuit component 20 of this embodiment includes a step for setting the three-dimensionally formed circuit sheets 21 and 22 obtained using the above method in a mold for injection molding, and integrally molding the sheets 21, 22 with a resin base member 3.

According to the present invention, therefore, the circuit pattern formed on the resin film is not broken when forming it into a three-dimensional shape, and the formation of the circuit pattern does not require complicated processes, such as electroless plating and the transfer of the circuit pattern. Thus, a three-dimensionally formed circuit sheet and component having a three-dimensional structure can be fabricated using a simple manufacturing process with least adverse impact on global environments.

It should be apparent to those skilled in the art that the present invention can be embodied in many other specific forms without departing from the spirit or scope of the invention. Particularly, it should be understood that the invention may be embodied in the following forms.

The three-dimensionally formed circuit sheet 10 may be formed into any three-dimensional shape.

A plurality of the three-dimensionally formed circuit sheets 10 may also be laminated to produce a multi-layer three-dimensionally formed circuit sheet.

The three-dimensionally formed circuit component 20 may be composed of any number of three-dimensionally formed circuit sheets and resin base members.

The examples of the three-dimensionally formed circuit sheet 10 and the three-dimensionally formed circuit component 20 of the invention will be described below.

EXAMPLES 1 to 3

An electrically conductive paste containing 100 parts by weight of a polycarbonate resin ink containing a polycarbonate resin of the formula (II) (Noriphan, available from Bayer Ltd., average molecular weight: 21,000) as the binder, and 150 parts by weight, 250 parts by weight, or 350 parts by weight of silver powder (flaky silver powder, average particle diameter: 2.3 μm) as electrically conductive powder was screen-printed on the back side of the resin film 1 to form a circuit pattern 2. As the resin film 1, a light-transmitting polycarbonate film was used. Thereafter, the resin film 1 including the circuit pattern 2 was press-molded in a mold to form a dome-shaped circuit sheet 10 as shown in FIG. 1.

EXAMPLES 4 to 6

A circuit sheet 10 was formed in the same manner as in Example 1, using a polycarbonate/polybutylene terephthalate alloy film (Bayfol, Bayer Ltd.) as the resin film 1, and an electrically conductive paste containing 100 parts by weight of each resin ink shown in Table 1 and 250 parts by weight of silver powder (flaky silver powder, average particle diameter: 2.3 μm) as electrically conductive powder.

COMPARATIVE EXAMPLE 1 to 3

A circuit sheet 10 was formed in the same manner as in Example 1, using a polycarbonate/polybutylene terephthalate alloy film (Bayfol, Bayer Ltd.) as the resin film 1, and an electrically conductive paste containing 100 parts by weight of each resin ink shown in Table 1 and 250 parts by weight of silver powder (flaky silver powder, average particle diameter: 2.3 μm) as electrically conductive powder.

Figure 3A:
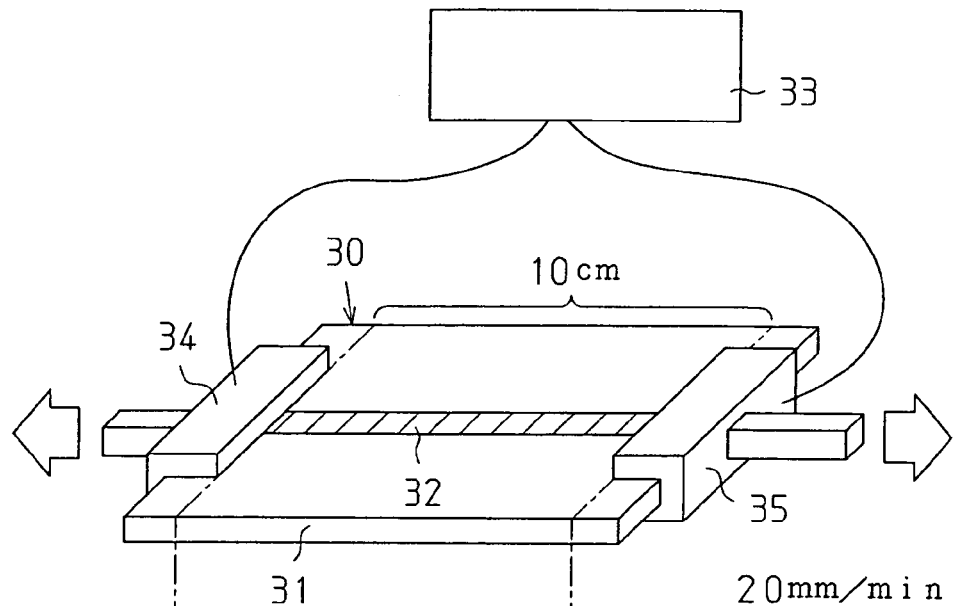
FIG. 3(*a*) is a perspective view showing an instrument for evaluating the formability of circuit sheets.
Figure 3B:
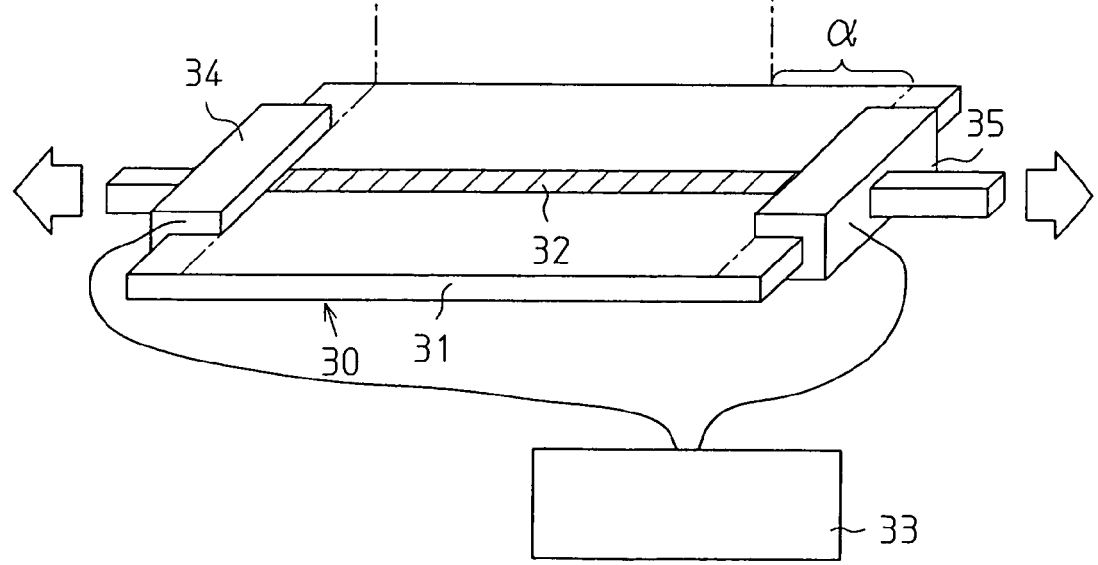

The formability of the each circuit sheet was evaluated using the following measuring method. As FIG. 3 shows, a circuit pattern 32 having a width of 1 mm was printed using each electrically conductive paste on film 31 having a thickness of 125 μm. Using a Strograph (Toyo Seiki Kogyou Co., Ltd.), both ends of each resin film 31 were held by the chucks 34 and 35 of the measuring instrument 33. At this time, the distance between the chucks 34 and 35 was set to 10 cm. While measuring the electric resistance between the chucks 34 and 35 in an atmosphere of 125°, the circuit sheet 30 was pulled in the length direction of the circuit pattern 32 at a speed of 20 mm/min, and the elongation α of the circuit sheet 30 when the electric resistance value exceeded 300 MΩ was recorded. When the elongation α of the circuit sheet 30 when the electric resistance value exceeded 300 MΩ was 70 mm or more, the circuit sheet 30 was judged to have excellent three-dimensional formability.

The adhesion between the circuit pattern and the resin film was evaluated by observing the state of the circuit pattern after elongation in the evaluation of formability. If the silver powder did not drop off, the adhesion was judged as "Good," and if the silver powder dropped off, the adhesion was judged as "No Good."

The volume resistance value of the circuit sheet before molding was measured as follows. A test circuit sheet was prepared of 125 μm thickness, printed with a 50 mm×80 mm rectangular pattern for each electrically conductive paste. The volume resistance values of these test circuit sheets were measured using a resistivity meter (Loresta GP, MCP-T600, Dia Instruments Co., Ltd.) according to a method with a four-point probe array (in conformity with JIS K7194).

With respect to Examples 1 to 6 and Comparative Examples 1 to 3, the volume resistance values of the circuit sheets before molding, the formability of the circuit sheets, and the adhesion between the circuit pattern and the resin film after molding are shown in Table 1.

TABLE 1

| | | Type of resin ink | Amount of resin ink | Amount of silver powder | Volume resistance ($\Omega \cdot$ cm) | Elongation $\alpha$ when electric resistance >300 M$\Omega$ | Adhesiveness |
|---|---|---|---|---|---|---|---|
| Examples | 1 | Polycarbonate-based | 100 | 150 | $4.475 \times 10^{-4}$ | 127 | Good |
| | 2 | Polycarbonate-based | 100 | 250 | $8.267 \times 10^{-5}$ | 73 | Good |
| | 3 | Polycarbonate-based | 100 | 350 | $1.507 \times 10^{-4}$ | 83 | Good |
| | 4 | Epoxy-based | 100 | 250 | $4.848 \times 10^{-4}$ | 97 | Good |
| | 5 | Acryl urethane-based | 100 | 250 | $3.874 \times 10^{-4}$ | 93 | Good |
| | 6 | Polyvinyl chloride/Acryl urethane based | 100 | 250 | $1.856 \times 10^{-4}$ | 130 | Good |
| Comp. Ex. | 1 | Polyvinyl chloride-based | 100 | 250 | $1.073 \times 10^{-4}$ | 53 | No Good |
| | 2 | Vinyl chloride/vinyl acetate copolymer-based | 100 | 250 | $7.213 \times 10^{-5}$ | 33 | No Good |
| | 3 | Polyolefin-based | 100 | 250 | $2.371 \times 10^{-4}$ | 30 | No Good |

The details of the resin inks in TABLE 1 are as follows:

| Type of resin Ink | Ingredients |
|---|---|
| Polycarbonate-based | Noriphan (Bayer Ltd.) |
| Epoxy-based | 1690N (Seiko advance Ltd.) Base resin: trimethylolpropane-type epoxy resin (50%) + bisphenol-A (28%) Curing agent: Modified aliphatic polyamine |
| Acryl urethane-based | MS8 (Seiko advance Ltd.) + D-110N (Mitsui Takeda Chemicals, Inc.) *weight ratio = MS8:D-110N = 1:1 |
| Polyvinyl chloride/Acryl urethane based | VIC (Seiko advance Ltd.) + D-110N (Mitsui Takeda Chemicals, Inc.) *weight ratio = VIC:D-110N = 1:1 |
| Polyvinyl chloride-based | VIC (Seiko advance Ltd.) |
| Vinyl chloride/vinyl acetate copolymer-based | CAV Meiban (Seiko advance Ltd.) |
| Polyolefin-based ink | PP Ink (Seiko advance Ltd.) |

EXAMPLE 7

An electrically conductive paste containing a polycarbonate-based resin ink (Noriphan, Bayer Ltd.) as the binder and 250 parts by weight of silver powder (flaky silver powder, average particle diameter: 2.3 μm) as electrically conductive powder was screen-printed on the upper surface of the resin film 1 to form a circuit pattern 2. As the resin film 1, a polycarbonate film was used. The resin film 1 printed with the circuit pattern 2 was press-molded in a mold to form a circuit sheet 22 having a dome-shaped protrusion.

On the circuit sheet 22, a circuit sheet obtained in Example 1 was overlaid as the upper circuit sheet 21, so that the circuit patterns faced each other. These sheets 21 and 22 were set in a mold for injection molding, the molten polycarbonate resin was injected into the depression of the circuit sheet. 22 and integrally molded, to form a circuit component 20 as shown in FIG. 2. In the circuit component 20 obtained, no breakage of the circuit patterns 2 occurred and good adhesion between the circuit sheets 21 and 22, and the circuit sheet 22 and the resin base member 3 was achieved.

The invention claimed is:

1. A three-dimensionally formed circuit sheet comprising: a resin film originally being in a flat sheet, and a circuit pattern formed of an electrically conductive paste on the resin film, the electrically conductive paste containing, as a binder, a resin that is three-dimensionally formable; wherein the resin contain a thermoplastic aromatic polycarbonate having a weight-average molecular weight of at least 10,000, and containing bifunctional carbonate structure units represented by the following formula (I),

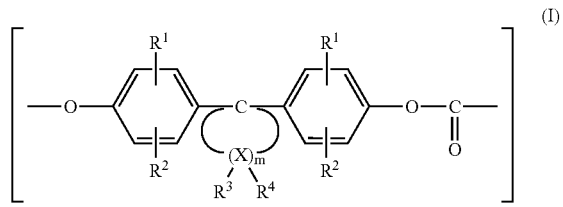

wherein $R^1$ and $R^2$ independently represent hydrogen, a halogen, $C_{1-8}$ alkyl, $C_{5-6}$ cycloalkyl, or $C_{6-10}$ aryl alkyl; m represents an integer from 4 to 7; $R^3$ and $R^4$ independently represent hydrogen or a $C_{1-6}$ alkyl, and can be independently selected with respect to each X; X represents at least one carbon atom; and both $R^3$ and $R^4$ are alkyl groups;

wherein the resin film and the circuit pattern are integrally formed into a three-dimensional shape from the flat sheet.

2. The three-dimensionally formed circuit sheet according to claim 1, wherein the electrically conductive paste comprises the resin and an electrically conductive powder.

3. The three-dimensionally formed circuit sheet according to claim 2, wherein the electrically conductive powder is silver powder.

4. The three-dimensionally formed circuit sheet according to claim 1, wherein the circuit sheet has a dome-shaped protrusion projecting outward from the flat sheet.

5. A three-dimensionally formed circuit component comprising:
a three-dimensionally formed circuit sheet including:
a resin film originally being in a flat sheet; and
a circuit pattern formed of an electrically conductive paste on the resin film, the electrically conductive paste containing, as a binder, a resin that is three-dimensionally formable, wherein the resin contains a thermoplastic aromatic polycarbonate having a weight-average molecular weight of at least 10,000, and containing bifunctional carbonate structure units represented by the following formula (I),

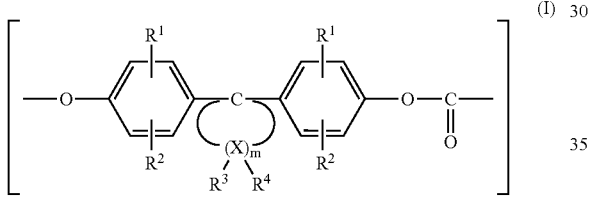

wherein, $R^1$ and $R^2$ independently represent hydrogen, a halogen, $C_{1-8}$ alkyl, $C_{5-6}$ cycloalkyl, or $C_{6-10}$ aryl alkyl; m represents an integer from 4 to 7; $R^3$ and $R^4$ independently represent hydrogen or a $C_{1-6}$ alkyl, and can be independently selected with respect to each X; X represents at least one carbon atom; and both $R^3$ and $R^4$ are alkyl groups, and wherein the resin film and the circuit pattern are integrally formed into a three-dimensional shape from the flat sheet; and a resin base member on which the three-dimensionally formed circuit sheet is laminated.

6. The three-dimensionally formed circuit component according to claim 5, wherein the electrically conductive paste comprises the resin and an electrically conductive powder.

7. The three-dimensionally formed circuit component according to claim 6, wherein the electrically conductive powder is silver powder.

8. The three-dimensionally formed circuit component according to claim 5, wherein the circuit sheet has a dome-shaped protrusion projecting outward from the flat sheet.

9. A three-dimensionally formed circuit sheet comprising:
a resin film originally being in a flat sheet, and
a circuit pattern formed of an electrically conductive paste on the resin film, the electrically conductive paste containing, as a binder, a resin that is three-dimensionally formable;

wherein the resin film and the circuit pattern are integrally formed into a three-dimensional shape from the flat sheet; and wherein the circuit sheet is stretchable by 70 mm or more in a longitudinal direction of the circuit pattern, when the circuit sheet is pulled in the longitudinal direction of the circuit pattern at a speed of 20 mm/min in an atmosphere of 125° C. and the electric resistance value of the circuit pattern exceeds 300 MΩ, wherein the circuit pattern has a width of 1 mm.

10. A three-dimensionally formed circuit component comprising:
a three-dimensionally formed circuit sheet including:
a resin film originally being in a flat sheet; and
a circuit pattern formed of an electrically conductive paste on the resin film, the electrically conductive paste containing, as a binder, a resin that is three-dimensionally formable, wherein the resin film and the circuit pattern are integrally formed into a three-dimensional shape from the flat sheet; and a resin base member on which the three-dimensionally formed circuit sheet is laminated;

wherein the circuit sheet is stretchable by 70 mm or mare in a longitudinal direction of the circuit pattern, when the circuit sheet is pulled in the longitudinal direction of the circuit pattern at a speed of 20 mm/min in an atmosphere of 125° C. and the electric resistance value of the circuit pattern exceeds 300 MΩ, wherein the circuit pattern has a width of 1 mm.

* * * * *